(12) United States Patent
Barlocchi et al.

(10) Patent No.: US 8,420,428 B2
(45) Date of Patent: *Apr. 16, 2013

(54) METHOD FOR FORMING BURIED CAVITIES WITHIN A SEMICONDUCTOR BODY, AND SEMICONDUCTOR BODY THUS MADE

(75) Inventors: Gabriele Barlocchi, Cornaredo (IT); Pietro Corona, Milan (IT); Dino Faralli, Milan (IT); Flavio Francesco Villa, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 146 days.

This patent is subject to a terminal disclaimer.

(21) Appl. No.: 12/873,685

(22) Filed: Sep. 1, 2010

(65) Prior Publication Data

US 2010/0330721 A1 Dec. 30, 2010

Related U.S. Application Data

(63) Continuation of application No. 11/486,387, filed on Jul. 12, 2006, now Pat. No. 7,811,848.

(30) Foreign Application Priority Data

Jul. 12, 2005 (IT) ............................ TO2005A0478

(51) Int. Cl.
*H01L 21/00* (2006.01)
*H01L 21/76* (2006.01)

(52) U.S. Cl.
USPC .............................. 438/48; 438/53; 438/422

(58) Field of Classification Search ................... 438/52, 438/48, 53, 49, 411, 421, 422; 257/E21.002
See application file for complete search history.

(56) References Cited

U.S. PATENT DOCUMENTS

| 6,570,217 | B1 * | 5/2003 | Sato et al. ...................... 257/327 |
| 6,670,257 | B1 * | 12/2003 | Barlocchi et al. ............. 438/422 |
| 7,069,952 | B1 | 7/2006 | McReynolds et al. |
| 7,193,256 | B2 | 3/2007 | Renna et al. |
| 7,811,848 | B2 * | 10/2010 | Barlocchi et al. ............... 438/52 |
| 2003/0168711 | A1 * | 9/2003 | Villa et al. .................... 257/506 |

FOREIGN PATENT DOCUMENTS

EP 1324382 A1 7/2003

* cited by examiner

*Primary Examiner* — Michael Trinh
(74) *Attorney, Agent, or Firm* — Graybeal Jackson LLP

(57) ABSTRACT

A method for the formation of buried cavities within a semiconductor body envisages the steps of: providing a wafer having a bulk region made of semiconductor material; digging, in the bulk region, trenches delimiting between them walls of semiconductor material; forming a closing layer for closing the trenches in the presence of a deoxidizing atmosphere so as to englobe the deoxidizing atmosphere within the trenches; and carrying out a thermal treatment such as to cause migration of the semiconductor material of the walls and to form a buried cavity. Furthermore, before the thermal treatment is carried out, a barrier layer that is substantially impermeable to hydrogen is formed on the closing layer on top of the trenches.

23 Claims, 14 Drawing Sheets

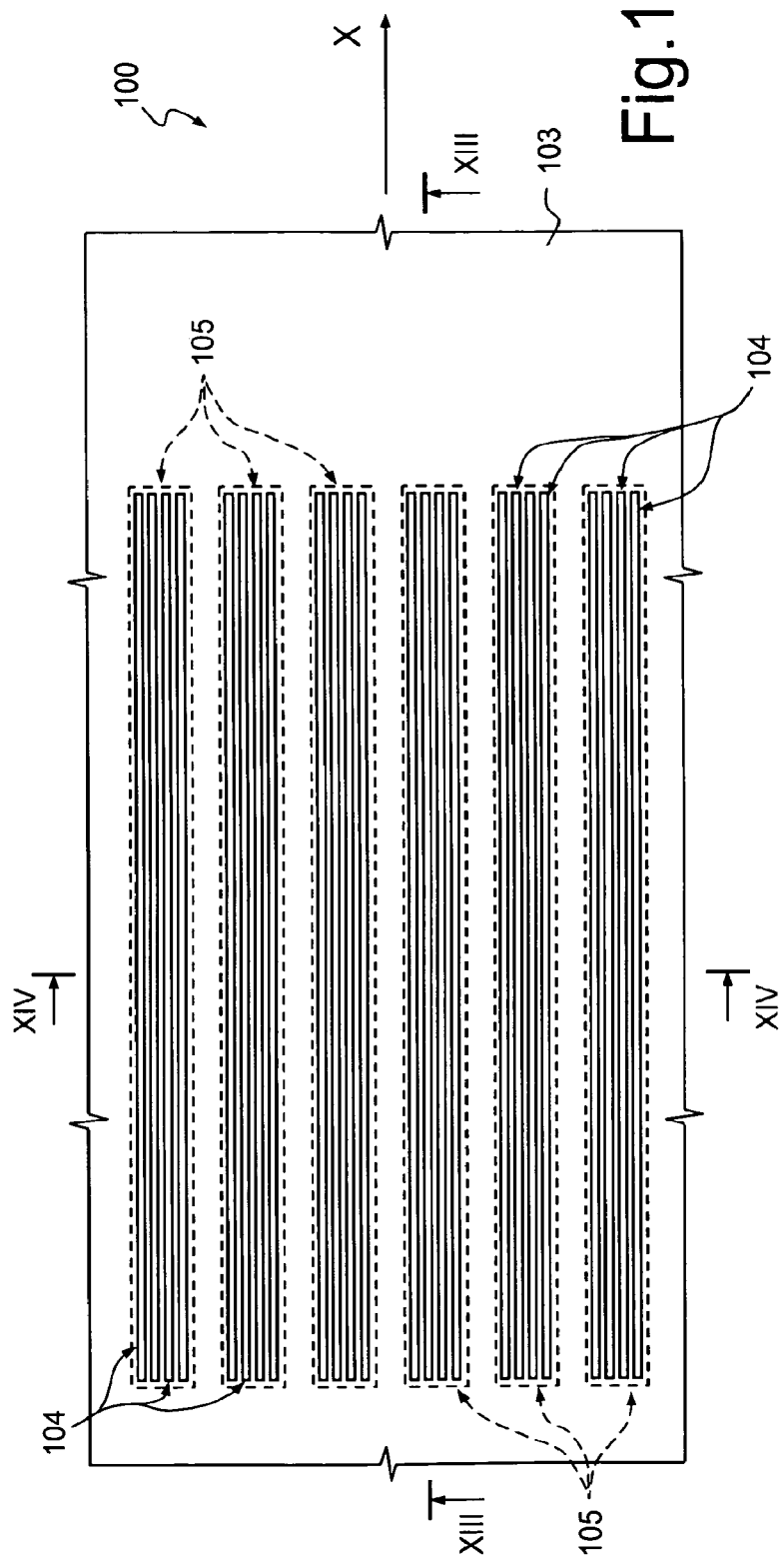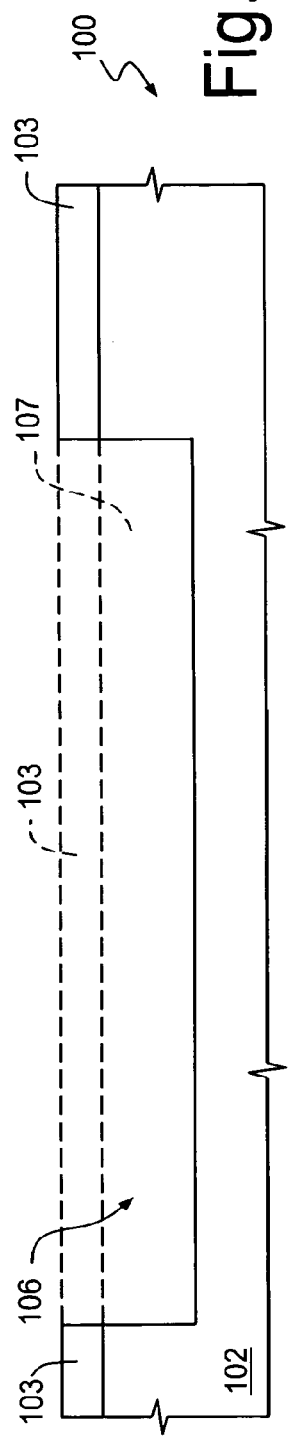

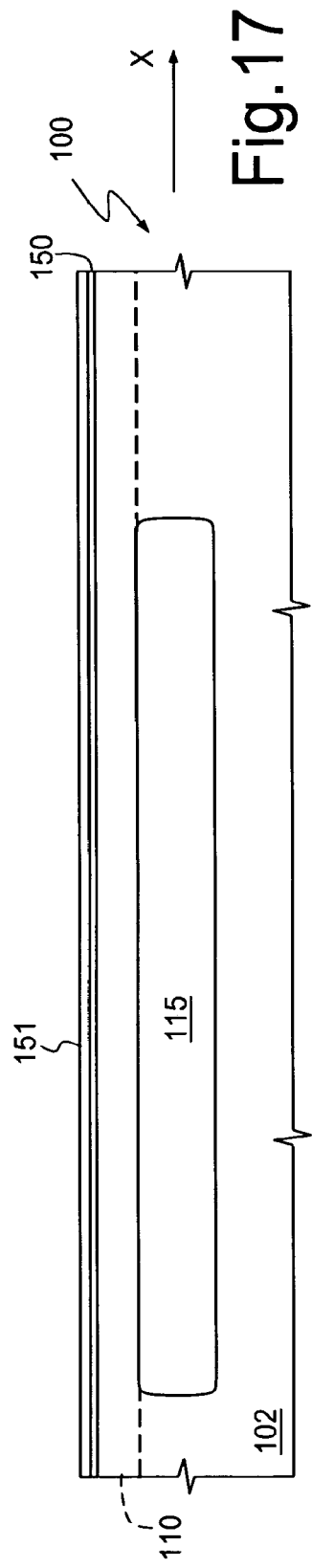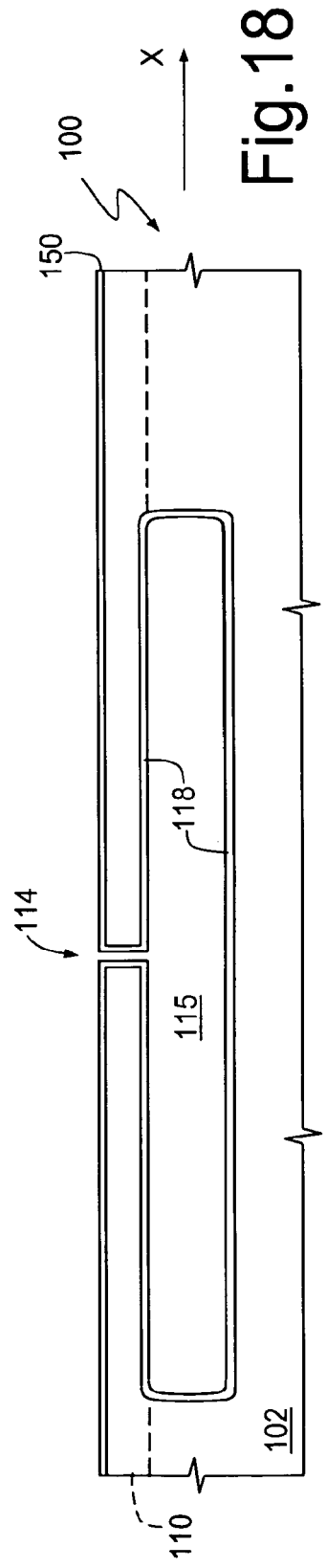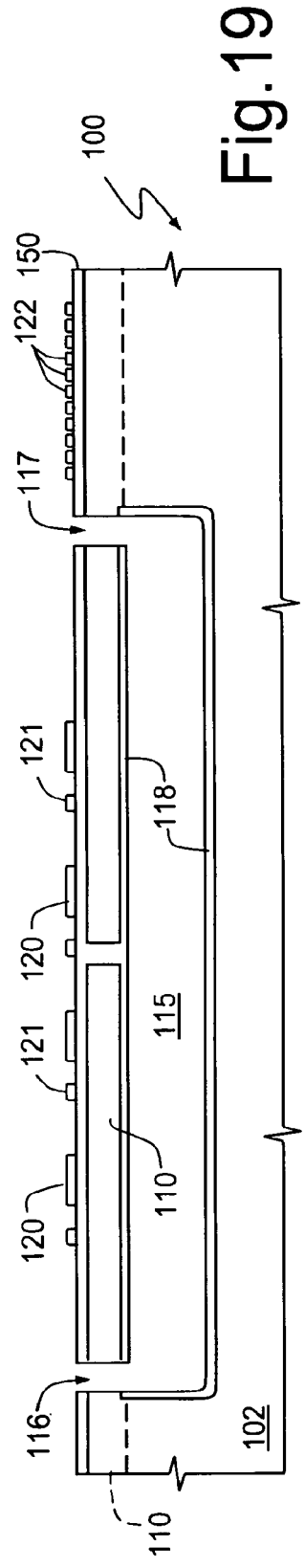

METHOD FOR FORMING BURIED CAVITIES WITHIN A SEMICONDUCTOR BODY, AND SEMICONDUCTOR BODY THUS MADE

PRIORITY CLAIM

The present application is a Continuation of U.S. patent application Ser. No. 11/486,387, filed Jul. 12, 2006 now U.S. Pat. No. 7,811,848, which application claims the benefit of Italian Patent Application No, TO2005A 000478, filed Jul. 12, 2005; all of the foregoing applications are incorporated herein by reference in their entireties.

TECHNICAL FIELD

An embodiment relates to a method for forming buried cavities within a semiconductor body.

BACKGROUND

As is known, many devices based upon semiconductor technology are provided with cavities, such as chambers or channels, buried in a semiconductor body. In some cases, such as for example in pressure sensors, the cavities are sealed in a gas-tight way by deformable membranes. In this way, within the cavities themselves a constant reference pressure value is maintained at rest, whereas variations of the external pressure cause deformations of the membrane, which can be detected in various known ways. Typically, variations of the capacitive coupling are detected between the membrane and the underlying semiconductor body, or else piezoresistive circuit elements coupled in a Wheatstone-bridge configuration are used. In other devices, such as microfluidic devices that can be used for example as chemical microreactors or for the fabrication of ink-jet printer heads, the cavities comprise microchannels forming a microfluidic circuit. In this case, the microfluidic circuit is generally accessible from the outside through openings so as to receive the fluids necessary for operation of the device.

The formation of buried cavities or in any case of covered cavities in general raises some difficulties.

In order to overcome said difficulties, use of thermal processes of annealing has been proposed, which enable buried cavities of arbitrary shape to be obtained starting from trenches dug in a semiconductor body, causing a migration of the surrounding atoms. According to the technique described in EP-A-1 324 382, which is incorporated by reference, a semiconductor body, made, for example, of silicon, is initially anisotropically etched in order to dig adjacent trenches, close to one another and separated by diaphragms. The trenches are then closed without being filled by growing an epitaxial layer. Alternatively, instead of the trenches separated by diaphragms, it is possible to define a honeycomb structure of silicon pillars at a small distance from one another.

The epitaxial growth is performed in a deoxidizing environment rich in hydrogen, which remains trapped in the trenches (or in the interstices between the pillars) and is subsequently exploited in order to carry out an annealing step. In practice, the semiconductor body is heated to a pre-set temperature and for a pre-set time. Thanks to the deoxidizing atmosphere (rich in molecular hydrogen), the semiconductor material surrounding the cavity is subject to migration and tends to redistribute according to a minimum-energy configuration, maintaining in any case the order of the monocrystal. The diaphragms (or pillars) are thinned out progressively until they disappear altogether, and a single cavity is basically formed, closed by a portion of the epitaxial layer, which forms a suspended semiconductor membrane.

The known techniques present limits however. In fact, it has been noted that, during annealing, the hydrogen contained within the cavities tends to be dispersed through the epitaxial layer, which is thinner and partially permeable. Mere heating of the semiconductor body is not, therefore, as a rule sufficient to complete migration and obtain buried cavities of the desired shape. In order to prevent impoverishment of the internal deoxidizing atmosphere that may render the treatment ineffective, the annealing is likewise carried out in a controlled environment. Special machinery is hence often necessary, capable of controlling the environmental concentrations of gaseous species (in particular, hydrogen), such as for example epitaxial reactors or hydrogen ovens.

SUMMARY

An embodiment is a method for forming buried cavities within a semiconductor body and a semiconductor body comprising buried cavities, which will enable one or more of the limitations described to be overcome.

BRIEF DESCRIPTION OF THE DRAWINGS

For an understanding of the present disclosure, one or more embodiments thereof are now described purely by way of non-limiting example, with reference to the attached drawings.

FIG. 12 is a top plan view of a wafer of semiconductor material in an initial fabrication step, according to a third embodiment.

FIG. 13 shows a cross section through the wafer of FIG. 12 in a subsequent fabrication steps, taken along the line XIII-XIII of FIG. 12 according to an embodiment.

FIGS. 17-20 show sections through the wafer of FIGS. 12-16 in subsequent fabrication steps, taken along the line XVII-XVII of FIG. 16 according to an embodiment.

DETAILED DESCRIPTION

According to a first embodiment, the disclosure is exploited for providing a capacitive pressure sensor made of semiconductor material. This must not, however, be considered as in any way limiting the scope of the present disclosure, in so far as embodiments can advantageously be exploited for the fabrication of devices of an altogether different type, incorporating buried cavities.

The present process is based upon the process disclosed in EP-A-1 324 382 for manufacturing a SOI wafer, and, more precisely, refers to the second embodiment shown in FIGS. 11-14 of said document.

Figure 1:
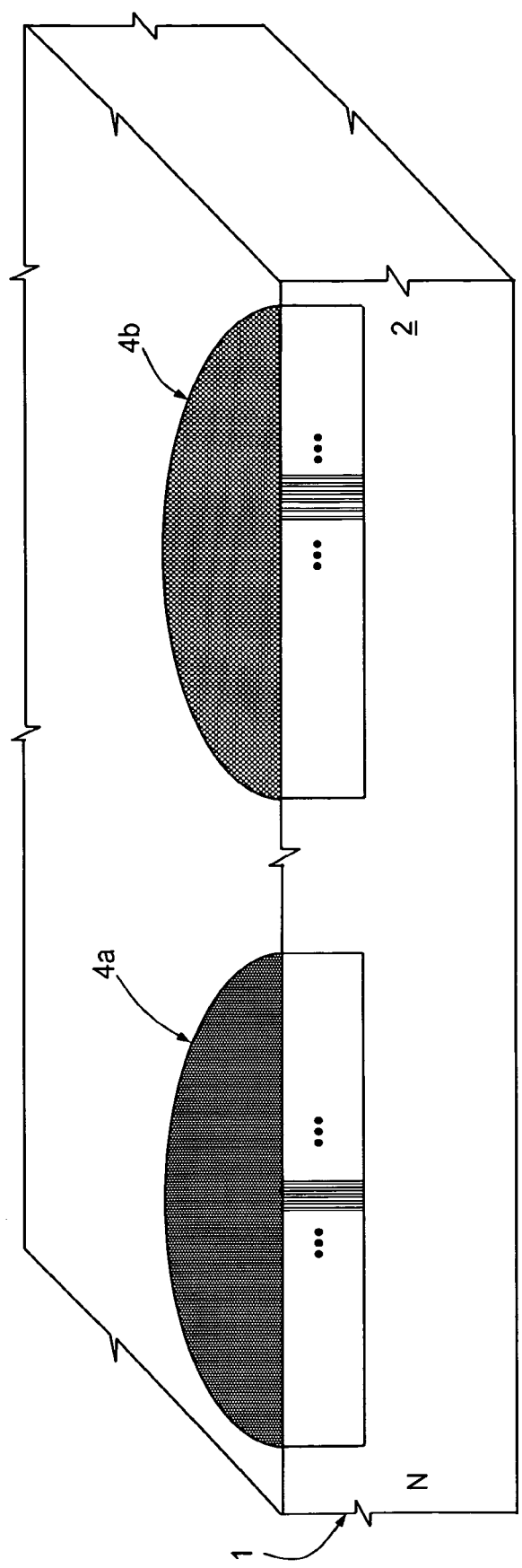
FIG. 1 shows a cross section through a wafer made of semiconductor material in an initial step of fabrication, according to a first embodiment.
Figure 3:
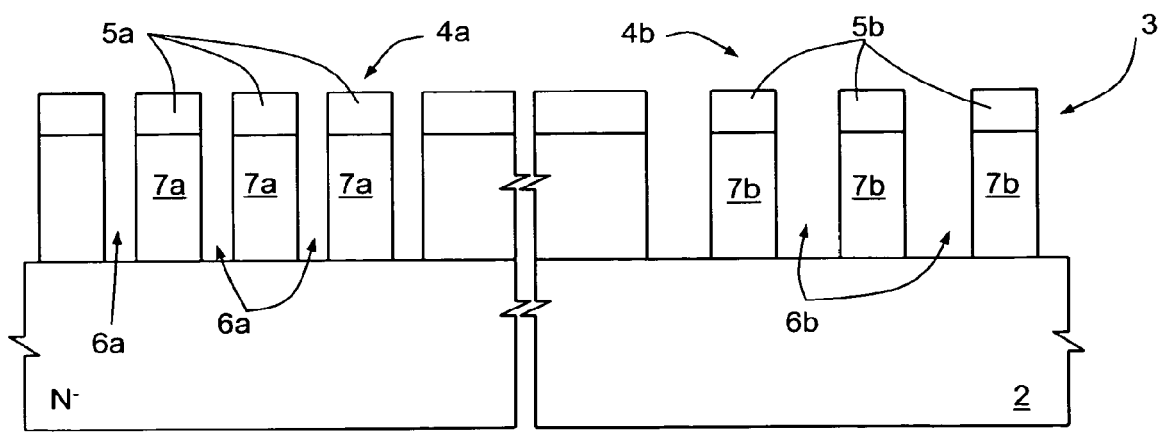
FIG. 3 is a cross-section of details of FIG. 2, at an enlarged scale according to an embodiment.

FIG. 1 shows a wafer 1 of semiconductor material, preferably monocrystalline silicon, comprising an N-type substrate 2, designed to form the bulk of the device according to an embodiment. A mask 3 made of resist or of another sacrificial layer (visible in the enlarged detail of FIG. 3) is formed on the top surface of the substrate 2. The mask 3 has two circular areas, designated by 4a and 4b and hereinafter referred to as the sensor area and the reference area, in each of which a honeycomb lattice is defined, the two lattices being of different sizes.

Figure 2:
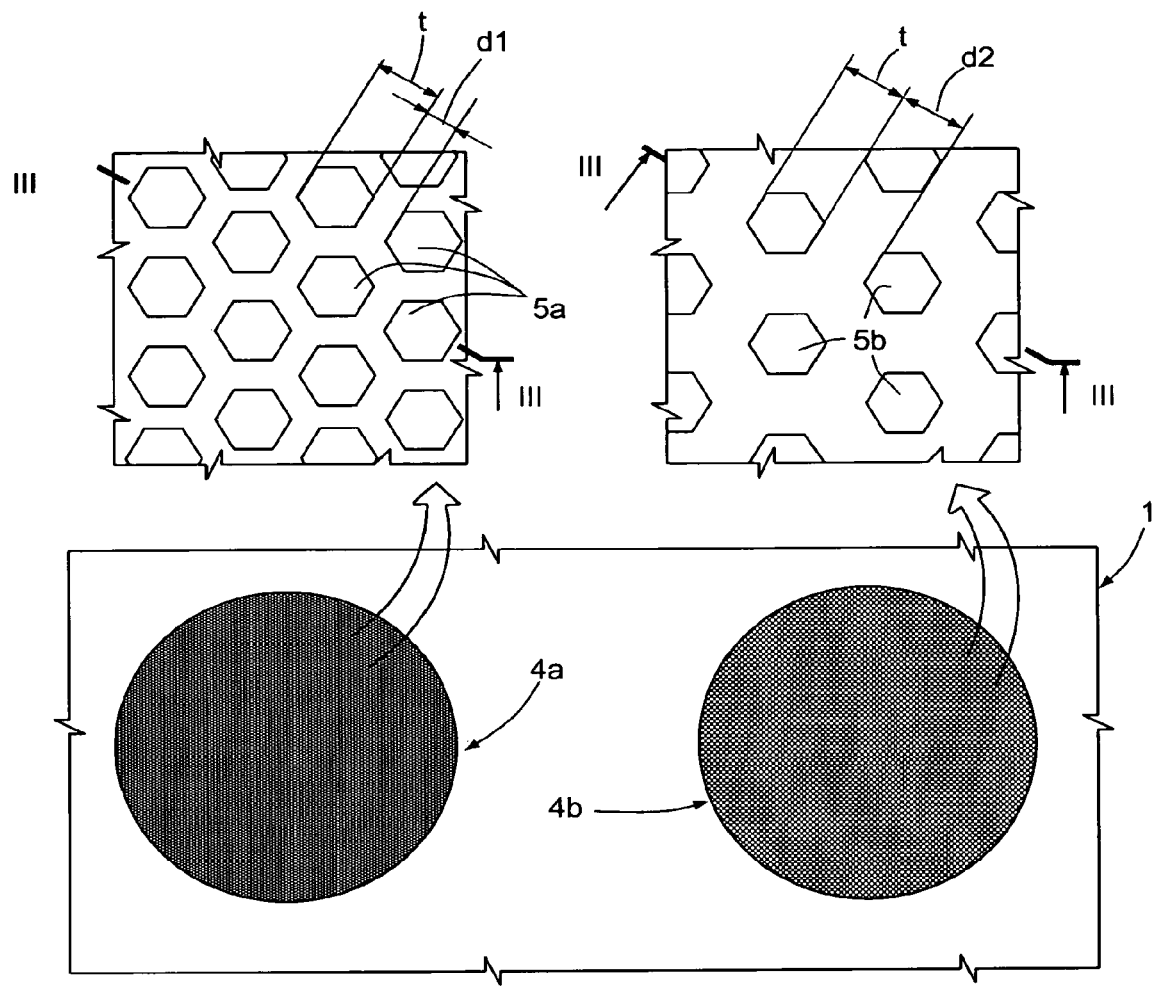
FIG. 2 is a top view of the wafer of FIG. 1 according to an embodiment.

In particular, as appears in the enlarged detail of FIG. 2, the sensor area 4a has mask regions 5a with a hexagonal shape arranged close to one another (see also the cross-section of FIG. 3), while the reference area 4b has mask regions 5b that are more widely spaced. For example, the distance t between opposite sides of the mask regions 5a and 5b may be 2 μm, the distance d1 between sides facing adjacent mask regions 5a may be 1 μm, and the distance d2 between sides facing adjacent mask regions 5b may be 2 μm.

Using the mask 3, trench etching of silicon of the substrate 2 is performed, so forming a sensor trench 6a and a reference trench 6b at the sensor area 4a and at the reference area 4b, respectively. The channels of the sensor and reference trenches 6a, 6b have, for example, a depth of approximately 10 μm, are of different widths, as may be seen in FIG. 3, and delimit silicon columns 7a and 7b, respectively, which are, for example, identical and have a shape corresponding to that of the mask regions 5a and 5b.

Figure 4:
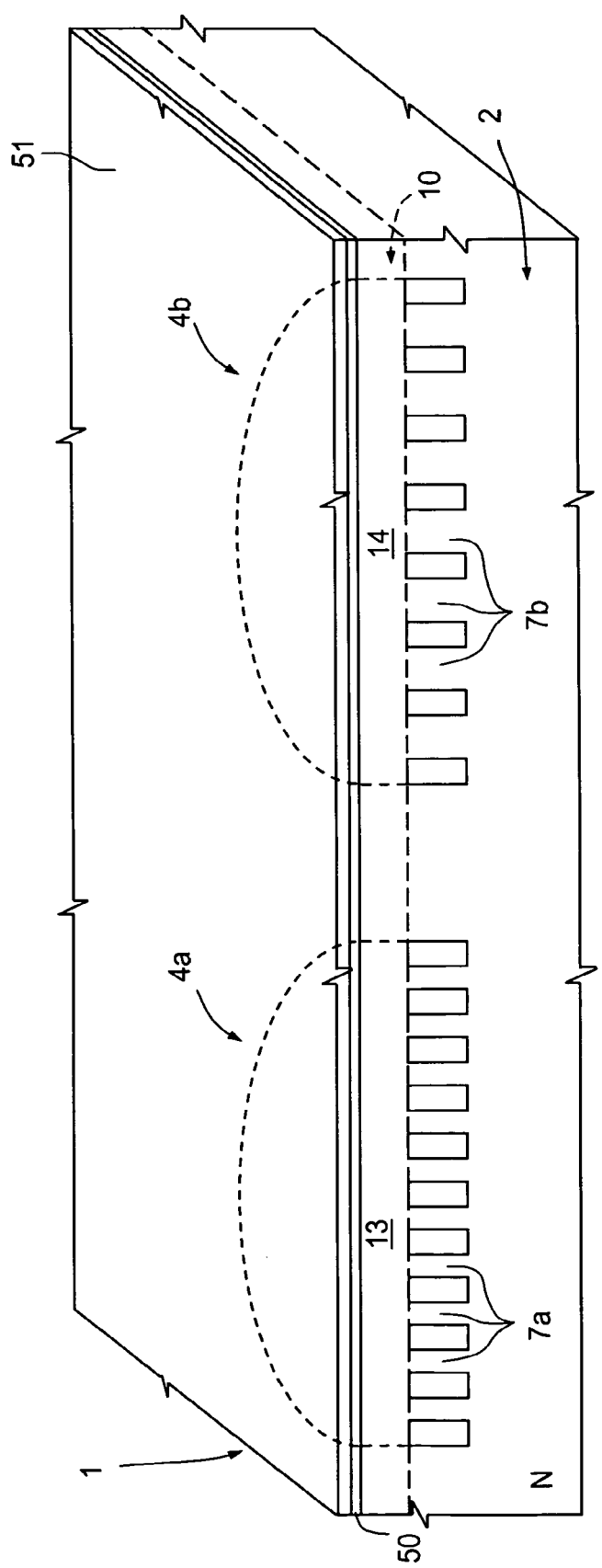
FIGS. 4-10 show cross sections through the wafer of semiconductor material of FIG. 1, in subsequent steps of fabrication, in the case of fabrication of a pressure sensor of a capacitive type according to an embodiment.

Next (see FIG. 4), the mask 3 is removed and an epitaxial growth is performed in a deoxidizing environment (typically, in an atmosphere with a high concentration of hydrogen, preferably using trichlorosilane—$SiHC_{l3}$). Consequently, an epitaxial layer 10 (shown only in FIG. 4 and hereinafter not distinguished from the substrate 2) of an N type, grows on top of the silicon columns 7a and 7b and closes, at the top, the sensor and reference trenches 6a, 6b, trapping the gas present therein (here, molecules of hydrogen $H_2$). The thickness of the epitaxial layer 10 is, for example, 9 μm.

At the end of the epitaxial growth, a pad-oxide layer 50 is formed over the entire epitaxial layer 10. For example, the pad-oxide layer 50 has a thickness of 80 nm. Then, a barrier layer 51 is deposited on top of the pad-oxide layer 50 by means of chemical vapor deposition (CVD). The thickness and material of the barrier layer 51 are such that the barrier layer 51 itself is substantially impermeable to molecular hydrogen $H_2$, in particular at the temperature at which the subsequent annealing step, which will be described hereinafter, will be performed. In the embodiment illustrated herein, the barrier layer 51 is made of silicon nitride and has a thickness of between 80 nm and 200 nm and, preferably, of 140 nm.

Figure 5:
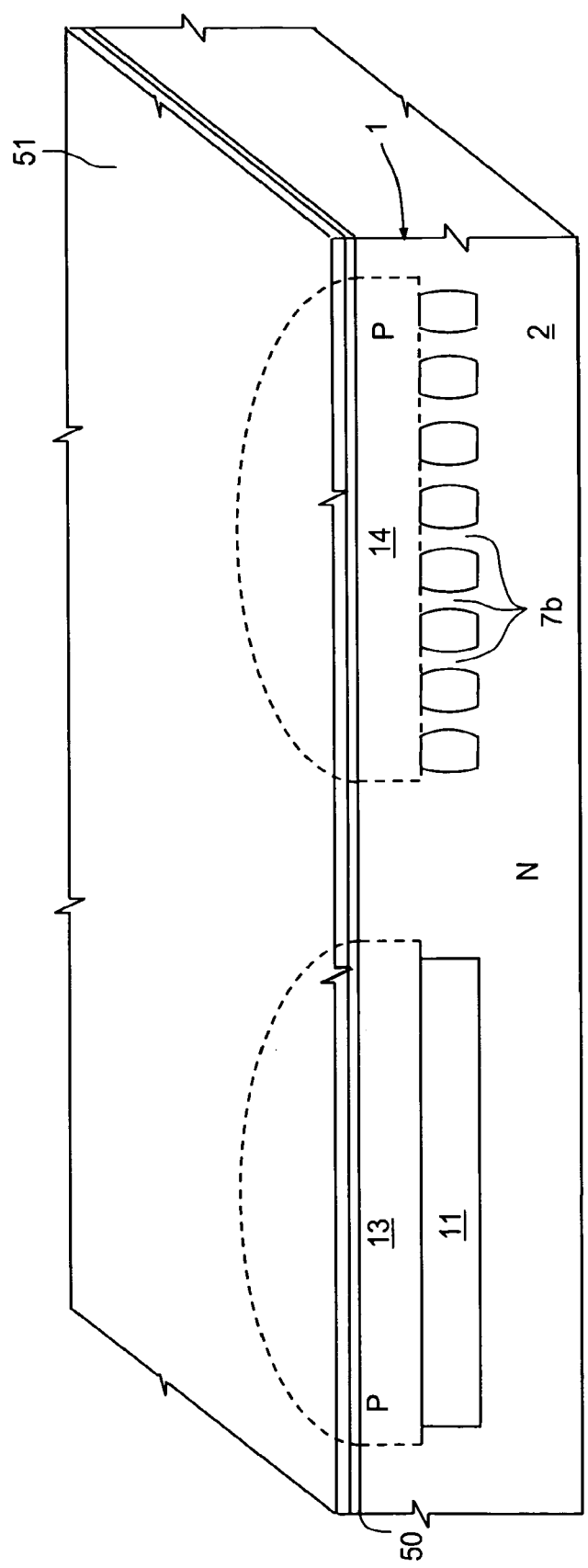

An annealing step is then carried out, for example for 12 hours at 1150° C. (FIG. 5).

As discussed in the aforementioned patent EP-A-1 324 382, the annealing step causes a migration of the silicon atoms, which tend to move into the lower-energy position. Consequently, at the sensor trench 6a, where the columns 7a are arranged close together, the silicon atoms migrate completely and form a sensor cavity 11, closed at the top by a membrane 13. On account of the presence of the sensor cavity 11 (having, for example, a diameter of 600 μm, according to the pressure to be applied), the membrane 13 is flexible and can be deflected under external stresses.

Instead, at the reference trench 6b, where the columns 7b are arranged at a larger distance apart, the migration of silicon atoms causes only a thinning of the columns 7b themselves, hereinafter indicated as pillars 15. In practice, a labyrinthine cavity 12 is formed, wider than the reference trench 6b. Furthermore, the pillars 15 present in the labyrinthine cavity 12 prevent movement to the overlying region, hereinafter referred to as electrode region 14.

During the annealing step, the barrier layer 51 prevents completely or at least drastically reduces the leakage of hydrogen within the sensor trench 6a and the reference trench 6b. Consequently, annealing can substantially be performed in any type of atmosphere.

The crystallographic quality of the membrane 13 is excellent, as is evident from tests carried out.

Figure 6:
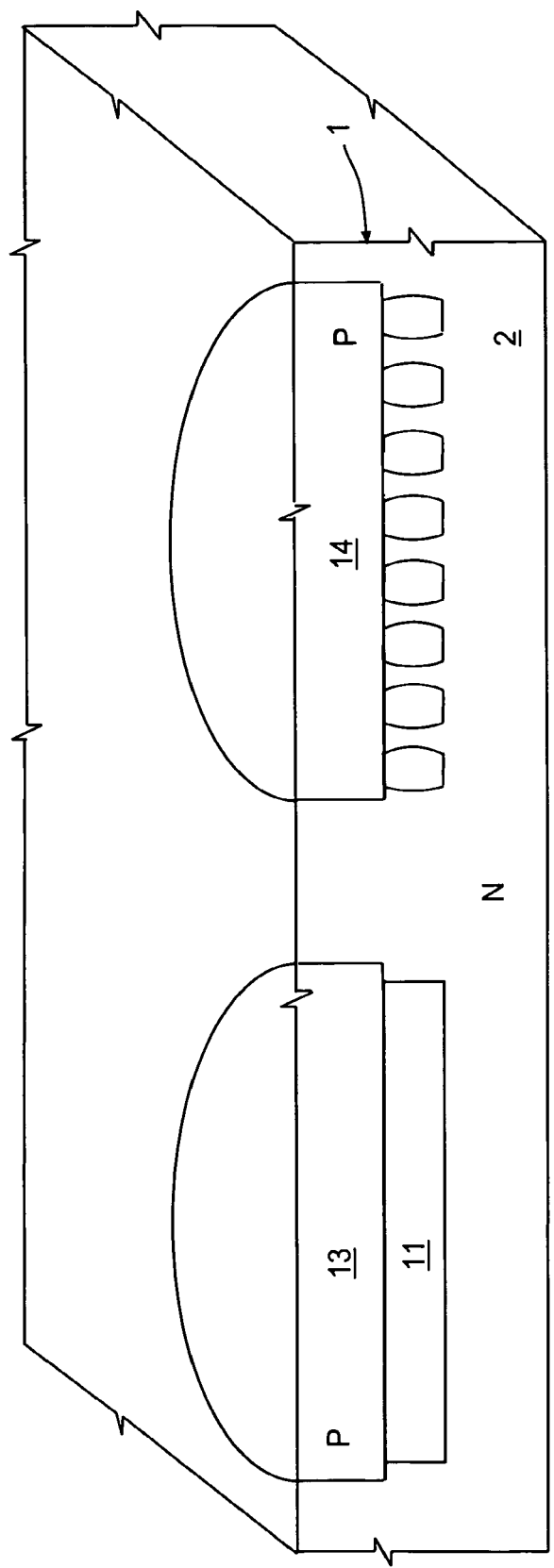
Figure 7:
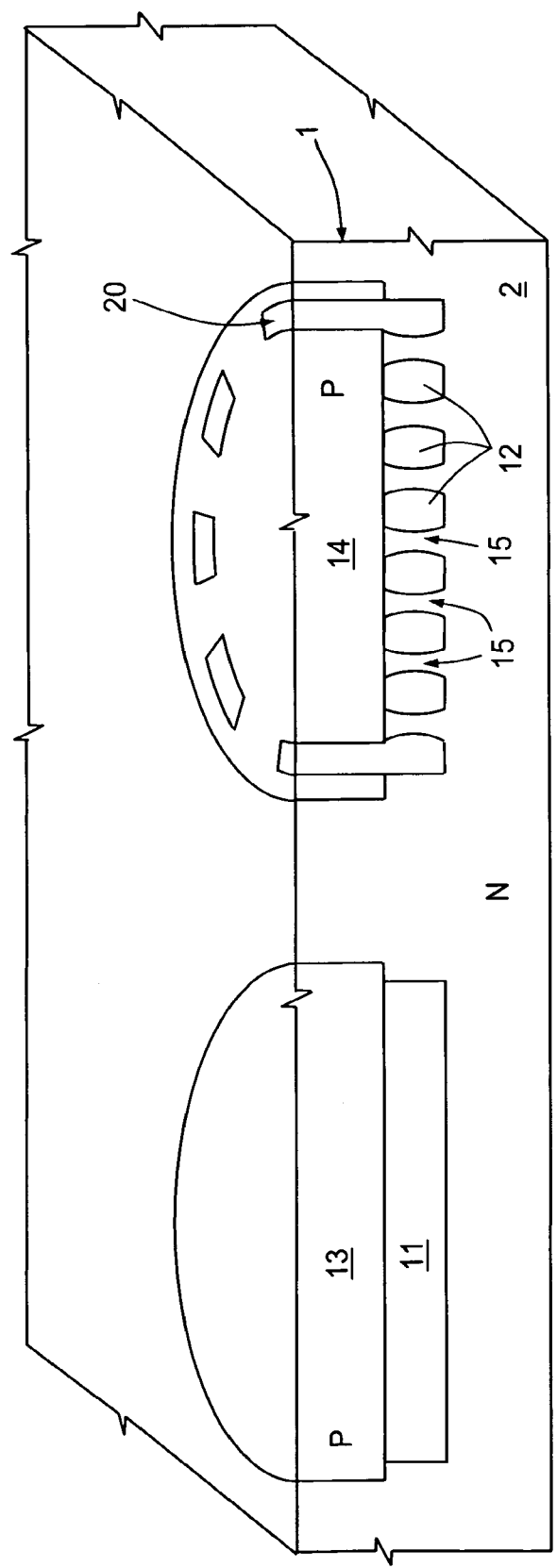

After complete removal of the barrier layer 51 and of the pad-oxide layer 50 (see FIG. 6), the membrane 13 and the electrode region 14 are doped via implantation of P-type dopant species, for example boron. Next (see FIG. 7), an access trench 20 is dug just in the electrode region 14, from the surface of the wafer 1 as far as the labyrinthine cavity 12. The access trench 20 preferably has the shape shown in FIG. 7, and hence extends, by stretches, in the proximity of the periphery of the area occupied by the labyrinthine cavity 12.

Figure 8:
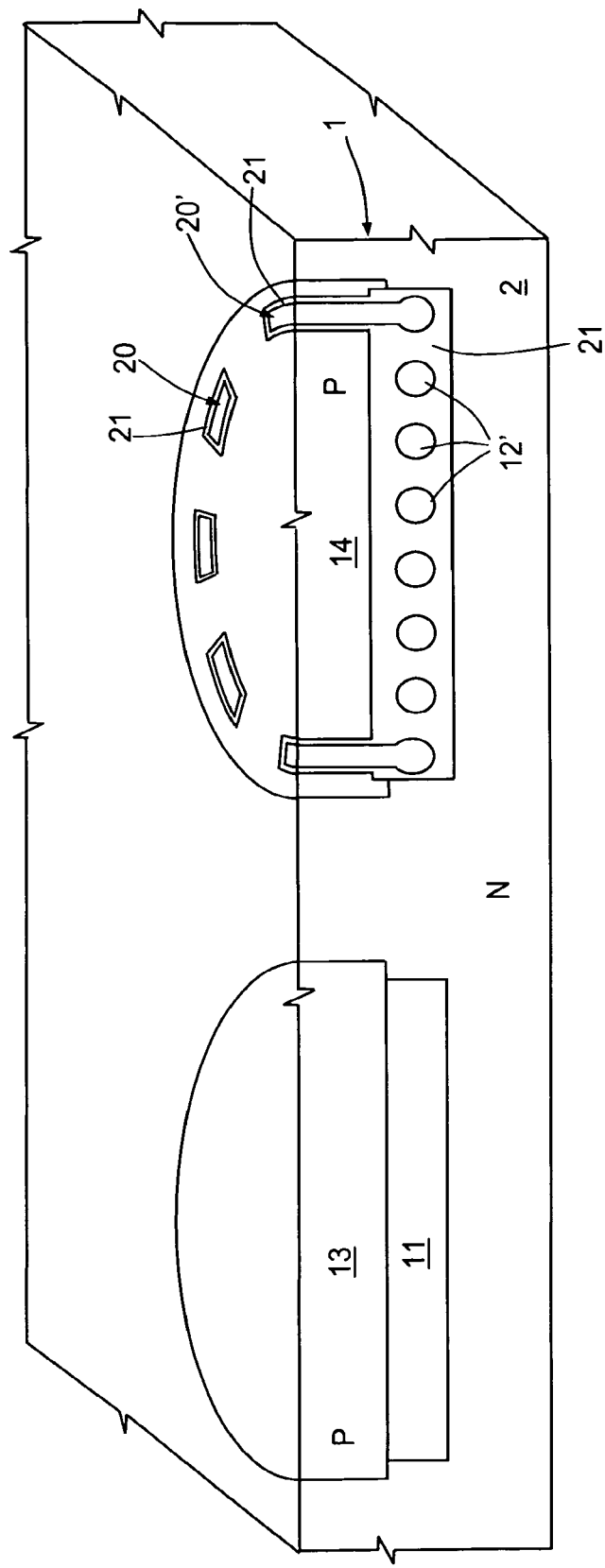

Thermal oxidation of the pillars 15 is then carried out so as to form an oxidized region 21 underneath the electrode region 14. The necessary oxygen is fed to the labyrinthine cavity 12 through the access trench 20. In this step, there is a gradual growth of the oxidized region 21 at the expense of the pillars 15 and of the silicon of the substrate 2 surrounding the access trench 20 and the labyrinthine cavity 12. In particular, the pillars 15 are completely oxidized and increase in volume. As shown in FIG. 8, the labyrinthine cavity 12 and the access trench 20 are filled in part with thermal oxide, but remain partially open (remaining portions 12' and 20' of the labyrinthine cavity and of the access trench).

Figure 9:
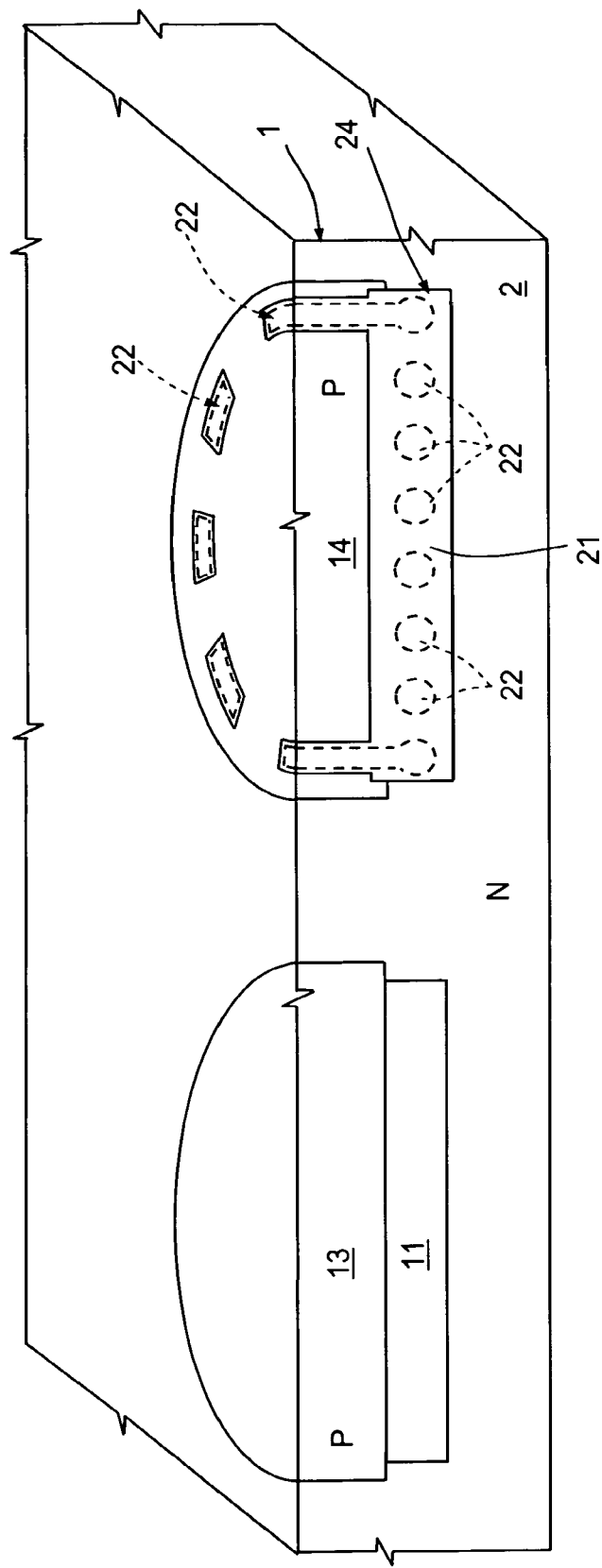

Next (see FIG. 9), the remaining portions 12' and 20' of the labyrinthine cavity and of the access trench are filled with insulating material 22, for example TEOS, forming, as a whole, an insulating region 24. In FIG. 9, for reasons of clarity of illustration, the demarcation line between the insulating material 22 and the oxidized region 21 is represented by a dashed line. As an alternative, the labyrinthine cavity 12' can remain empty, thus avoiding the filling step.

Figure 10:
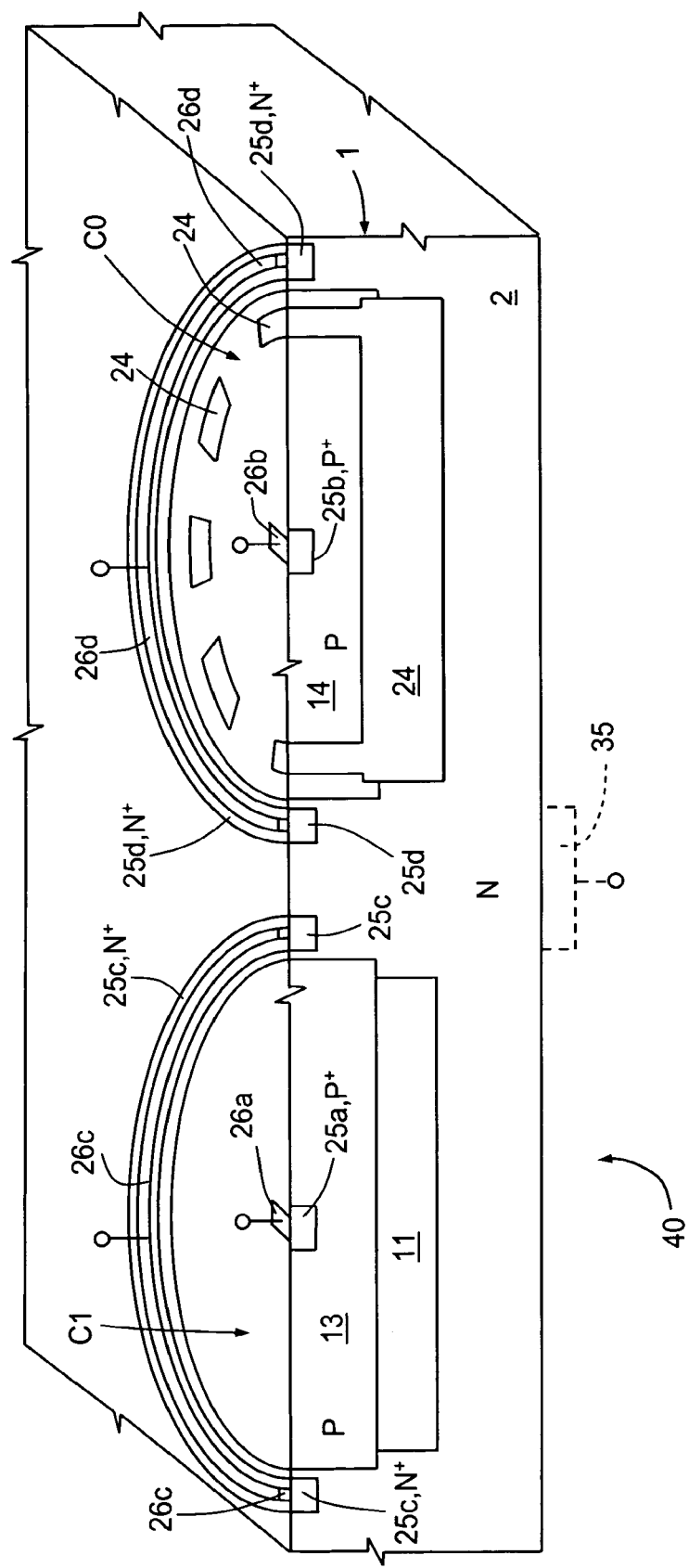

A P-type implantation, an N-type implantation and respective diffusion steps are then carried out in order to form $P^+$-type contact regions 25a, 25b above the membrane 13 and the electrode region 14 as well as $N^+$-type contact regions 25c, 25d above the substrate 2 (see FIG. 10). The contact regions 25c, 25d preferably have an annular shape and extend, respectively, around the membrane 13 and around the electrode region 14. Next, metal contacts 26a, 26b, 26c and 26d are formed and contact the contact regions 25a to 25d, respectively.

In practice, the structure of FIG. 10 constitutes a sensor 40 including two capacitors, designated by C1 and C0, which have: as first electrode the membrane 13 and the electrode region 14, respectively; as second electrode, the bulk region underlying the membrane 13 and the bulk region underlying the electrode region 14, respectively; and as dielectric, the sensor cavity 11 and the insulating region 24 (or the oxidized region 21 and the labyrinthine cavity 12'), respectively.

The capacitor C1 (referred to also as sensing capacitor) represents the element sensitive to the pressure that is applied on the membrane 13, whilst the capacitor C0 (reference capacitor) represents the reference element, which supplies the rest capacitance. Since the areas of the P/N junctions of the sensing capacitor C1 and of the reference capacitor C0 are equal, these capacitors have the same junction capacitance and the same leakage currents. In addition, the reference capacitor C0 may undergo a trimming step at the wafer level, using one or more known capacitors arranged in parallel and using a one-time programmable (OTP) device.

If so desired, prior to formation of the contact regions 25a-25d, it is possible to create the electronic components making up the control circuitry, which can be integrated on the same chip of the pressure sensor.

Finally, in a way not shown, the wafer 1 is cut into dies, each containing a sensing capacitor C1 and a reference capacitor C0 (as well as, if envisaged, the control circuitry), and the dies are encapsulated in such a way that the membrane 13 is accessible from the outside.

Therefore, an embodiment advantageously enables the annealing step to be carried out in a conventional oven. In fact, the barrier layer prevents the hydrogen trapped in the buried cavities from being dispersed through the epitaxial layer, which is partially permeable. The hydrogen trapped is hence sufficient to complete migration of the silicon towards the minimum-energy configuration when the wafer is heated. The need to compensate for the dispersion by controlling also the concentration of hydrogen in the external atmosphere in which the annealing has taken place is thus overcome. Annealing can hence be carried out in a conventional oven, and it is not necessary to use special machinery, such as epitaxial reactors or hydrogen ovens. Such an embodiment is hence simple to implement and economically advantageous. In addition, the use of a conventional oxidation oven enables more accurate control of the temperature and hence also uniformity of the thicknesses both of the membrane and of the pillars. Said thicknesses are in fact linked to the amount of migration of the silicon, which depends directly upon the temperature during the annealing.

Figure 11:
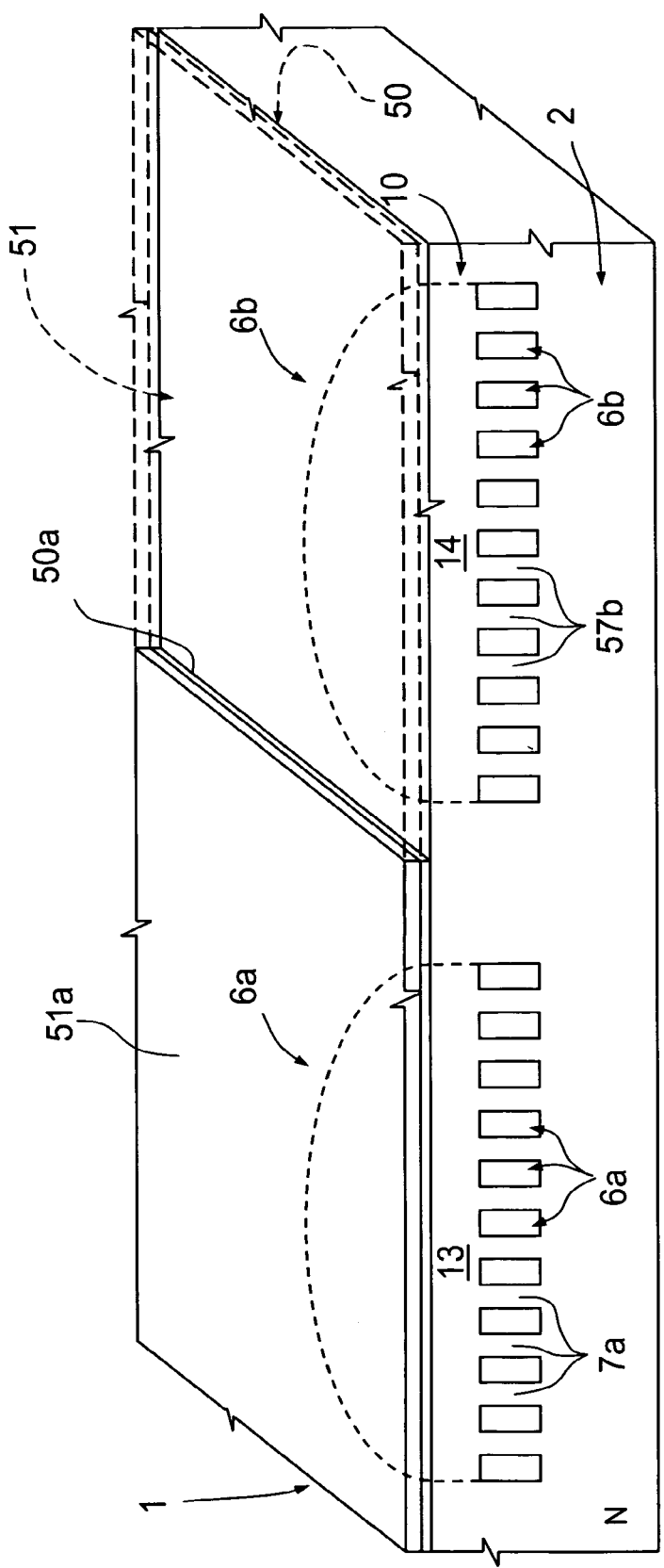
FIG. 11 shows a wafer of semiconductor material in an intermediate fabrication step, according to a second embodiment.

According to a different embodiment, to which FIG. 11 refers, the sensor trench 6a and the reference trench 6b are opened using a mask (not shown), which has two respective regions with honeycomb lattices that are the same as one another (consequently, the density of the columns 7a and their mutual distances in the sensor trench 6a and the density of the columns 57b and their mutual distances in the reference trench 6b are substantially the same). The pad-oxide layer 50 and the barrier layer 51 are deposited and then selectively removed on top of the reference trench 6b. Residual portions 50a, 51a of the pad-oxide layer 50 and of the barrier layer 51 are instead left on top of the sensor trench 6a.

The subsequent annealing step is carried out in a non-deoxidizing environment. Consequently, the deoxidizing atmosphere necessary for migration is preserved only within the reference trench 6a, which is protected by the residual portion 51a of the barrier layer 51. The hydrogen initially present in the reference trench 6b, instead, is dispersed progressively outwards through the epitaxial layer 10, left uncovered, and hence the deoxidizing atmosphere degrades progressively. Consequently, migration of the silicon around the reference trench 6b is much slower than around the sensor trench 6a and tends to stop. In practice, when the cavity sensor 11 is finally formed, the columns 57b in the reference trench 6b are only partially thinned out and form the pillars 15.

In practice, the use of the barrier layer 51 selectively on top of the sensor trench 6a and not on top of the reference trench 6b enables differentiated structures to be obtained starting from identical initial configurations and using a single annealing step. In particular, equal mask regions can advantageously be used in order to open the sensor trench 6a and the reference trench 6b.

The method proceeds as described above with reference to FIGS. 6-10.

In accordance to a third embodiment, illustrated in FIGS. 12-19, a microfluidic device for biochemical analyses, in particular for analysis of nucleic acids, is made.

As shown in FIG. 12, a wafer 100 of semiconductor material, preferably monocrystalline silicon, comprises a substrate 102 of an N type, designed to form the bulk of the device. On the surface of the substrate 102 a resist mask 103 is formed, having a plurality of slits 104 parallel to one another and extending in a direction X. The slits 104 are set alongside one another and organized in groups on top of channel areas 105, which have a shape elongated in the direction X and are in turn parallel to one another. In FIG. 12, six parallel channel areas 105 are shown, but their number can differ.

Figure 14:
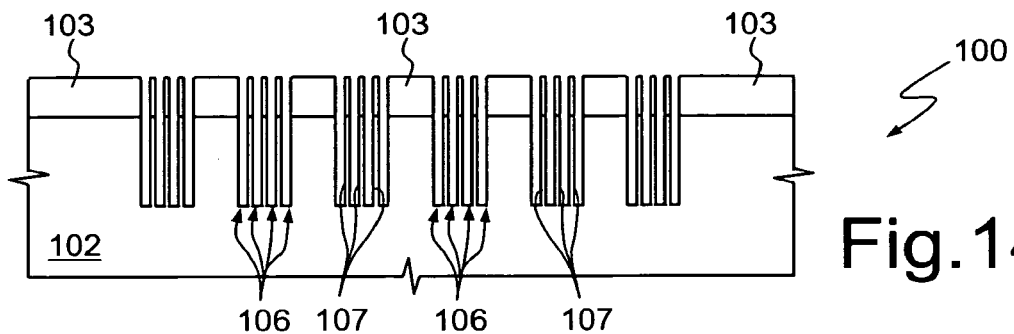
FIGS. 14-16 show sections through the wafer of FIG. 12 in subsequent fabrication steps, taken along the line XIV-XIV of FIG. 12 according to an embodiment.
Figure 15:
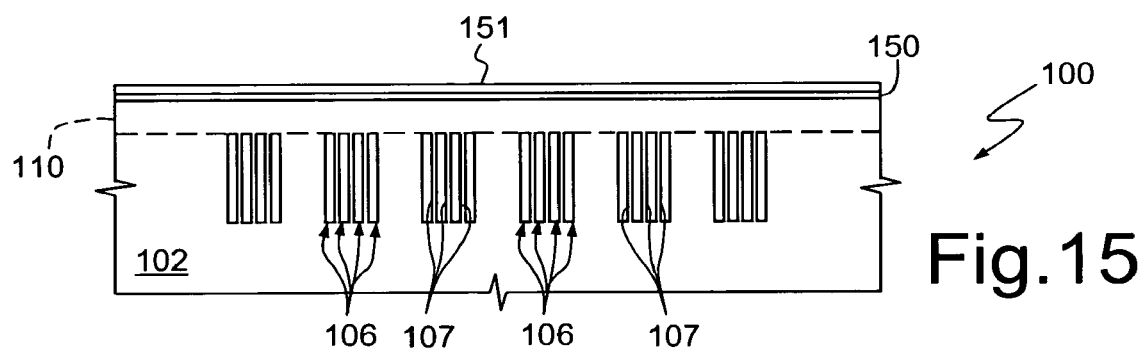

As shown in FIGS. 13 and 14, the mask 103 is used to carry out a trench etch of the silicon of the substrate 102 and form a plurality of trenches 106, through the slits 104. The trenches 106 of each channel area 105 have the same size in the direction transverse to the direction X (for example, 1 μm) and have the same depth, for example, of approximately 10 μm. In addition, adjacent trenches 106 delimit, and are separated by, thin silicon diaphragms 107 (the thickness of the diaphragms 107 is approximately of the same order of magnitude as the size of the trenches 106 in a direction transverse to the direction X). In practice, in each channel area 105 the diaphragms 107 are arranged in a comb-like configuration, and the trenches 106 are evenly spaced apart from one another.

Next (see FIG. 15), the mask 103 is removed, and an epitaxial growth is performed in deoxidizing environment (typically, in an atmosphere having a high concentration of hydrogen, preferably using trichlorosilane-$SiHCl_3$). Consequently, an N-type epitaxial layer 110 grows on top of the silicon diaphragms 107 and closes the trenches 106 at the top, trapping the gas present (here, molecules of hydrogen $H_2$). The thickness of the epitaxial layer 110 is, for example, 10 μm.

At the end of the epitaxial growth, a pad-oxide layer 150, having, for example, a thickness of 80 nm, is deposited over the entire epitaxial layer 110. Next, a barrier layer 151 is formed on top of the pad-oxide layer 150 by means of CVD. The thickness and material of the barrier layer 151 are such that the barrier layer 151 itself is substantially impermeable to molecular hydrogen $H_2$, in particular at the temperature at which the subsequent annealing step, which will be described hereinafter, will be carried out. In the embodiment illustrated herein, the barrier layer 151 is made of silicon nitride and has a thickness of 140 nm.

Figure 16:
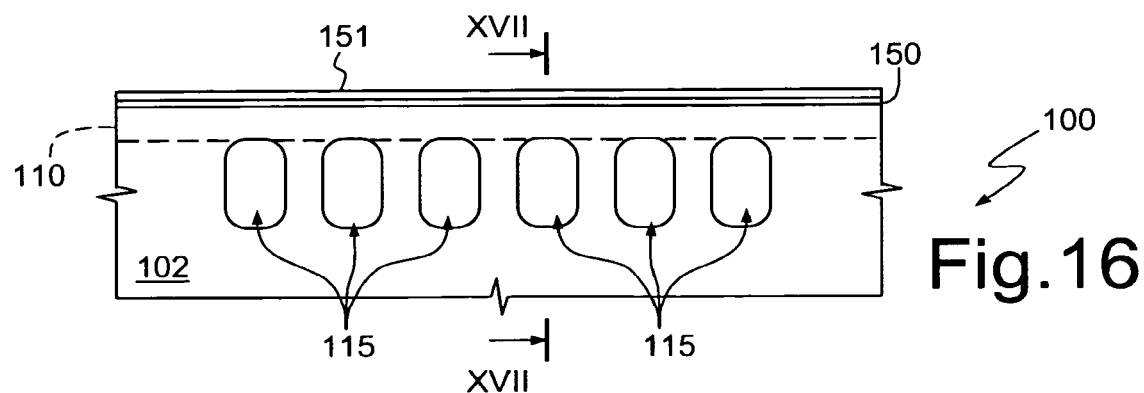

An annealing step is then performed, for example for 12 hours at 1150° C. (FIGS. 16 and 17). On account of the migration of the silicon atoms towards the lower-energy configuration, the diaphragms 107 are first thinned out and then consumed totally. Consequently, the trenches 106 of each channel area 105 join to one another and form a respective microfluidic channel 115, buried in the silicon (in the embodiment described herein, the buried microfluidic channels 115 number six—see FIG. 16). In greater detail, the microfluidic channels 115 are dug in the substrate 102 and are coated by the epitaxial layer 110, which serves as closing layer. The microfluidic channels 115 are moreover parallel and have a length that is substantially equal to the size of the channel areas 105 in the direction X. During the annealing step, the barrier layer 151 prevents leakage of hydrogen within the trenches 106. Consequently, the annealing can be carried out substantially in any type of atmosphere.

After complete removal of the barrier layer 151 (see FIG. 18), through holes 114 are opened through the epitaxial layer 110, at the centre with respect to the microfluidic channels 115. By means of a slight thermal oxidation, a passivation layer 118 is then formed, which coats the surface of the microfluidic channels 115 completely. The through holes 114 re-close during the thermal oxidation, on account of the tendency of the oxide to grow both inside and outside the silicon. In this step, the thickness of the pad-oxide layer 150 increases slightly.

Then, as shown in FIG. 19, made on the pad-oxide layer 150 are: heaters 120, set bestriding the microfluidic channels 115 and at a uniform distance from one another; temperature sensors 121, associated with respective heaters 120; and an array of detection electrodes 122, in addition to connection lines (not illustrated herein). The heaters 120, the temperature sensors 121, and the electrodes 122 can be all made by depositing and delineating a single metal layer. Alternatively, the heaters 120 can be made of polycrystalline silicon. The array of electrodes 122 is formed in a detection region adjacent to the outlets 117 of the microfluidic channels 115. In a subsequent step, the electrodes 122 are functionalized by grafting single-helix target DNA strands (probes), to be used as references during the analyses. After formation of the heaters 120, of the temperature sensors 121 and of the array of electrodes 122, a new trench etch of the wafer 100 is made to open inlets 116 and outlets 117 at opposite ends of the microfluidic channels 115. In this step, a resist mask is used (not shown).

Figure 20:
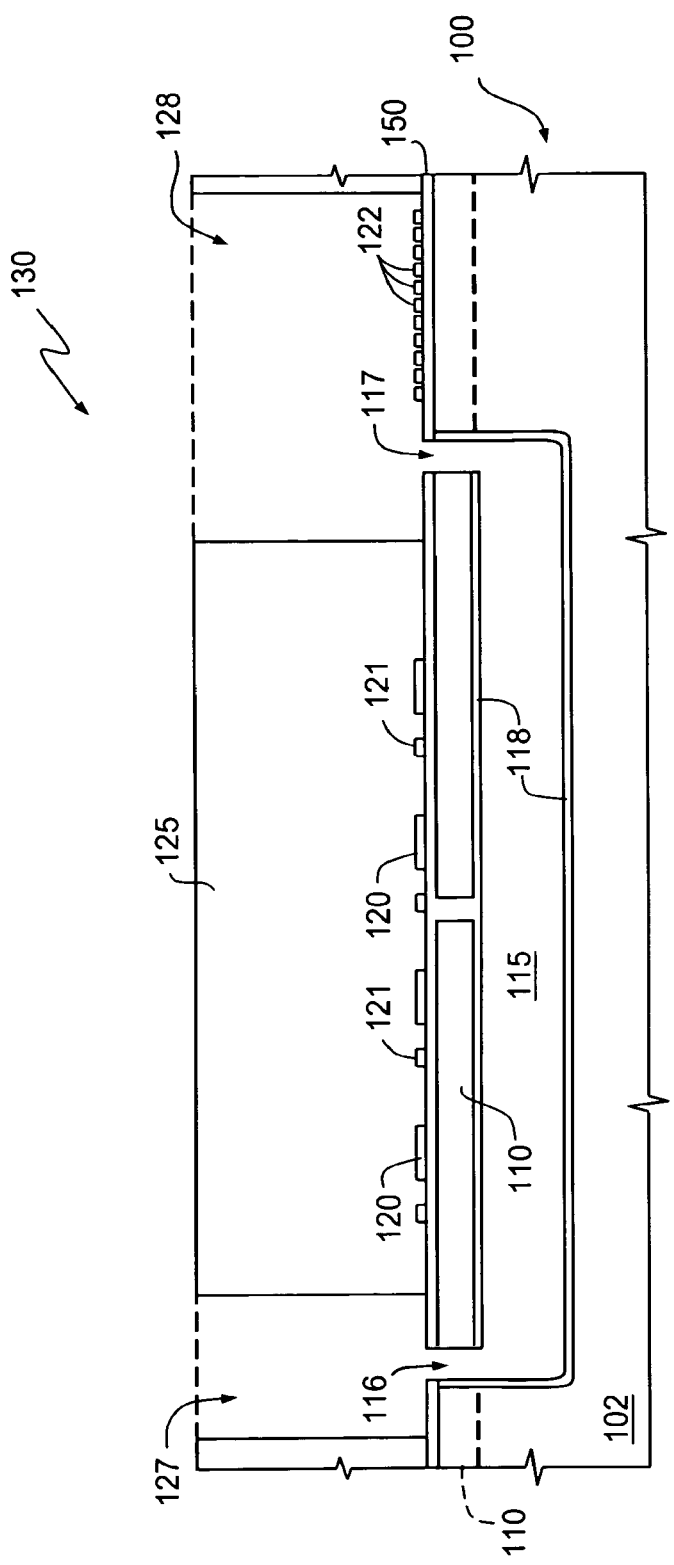

Finally (see FIG. 20), a structural layer 125 made of polymeric material, for example dry resist or SU-8, is deposited on the wafer 100 and then defined to form an inlet reservoir 127 and a detection chamber 128. The inlet reservoir is made so as to enable access to the microfluidic channels 115 from the outside, through the inlets 116. The detection chamber 128, into which the outlets 117 of the microfluidic channels 115 open, is formed around the array of electrodes 122.

A microfluidic device 130 for analysis of nucleic acids is thus obtained. In particular, in the microfluidic device 130, the inlet reservoir 127, the buried microfluidic channels 115, and the detection chamber 128 are in fluid coupling with one another by means of the inlets 116 and outlets 117, and form a microfluidic circuit. A fluid containing for example DNA and appropriate reagents is introduced into the inlet reservoir 127 and made to advance in a known way along the buried microfluidic channels 115 so as to be processed. In the example described, a process of amplification by means of polymerase-chain reaction (PCR) is envisaged. At the end of the amplification process, the fluid is made to advance further as far as the detection chamber 128 in order to hybridize the functionalized array of electrodes 122 (i.e., having a target DNA strand grafted thereon), for recognition of the sequences present.

Also in the fabrication of microfluidic devices, the barrier layer can be selectively removed on top of portions of the areas designed to house the channels, to obtain differentiated structures, such as channels of different cross sections or chambers, using a single annealing step.

One or more sensors, such as those described above or according to one or more embodiments, may be incorporated into an electronic system.

Finally, it is clear that numerous modifications and variations may be made to the process described and illustrated herein, without departing from the scope of the present disclosure.

What is claimed is:

1. A method, comprising:
   forming a trench having a shape in a bulk semiconductor region;
   introducing a deoxidizing fluid into the trench;
   forming a cover semiconductor region over the bulk semiconductor region to trap the deoxidizing fluid within the trench;
   forming over the trench and over a first portion of the cover semiconductor region a barrier layer that is substantially impermeable to the deoxidizing fluid within a predetermined temperature range; and
   thermally treating the bulk and cover semiconductor regions within the predetermined temperature range to modify the shape of the trench, the barrier layer being formed to substantially preserve the deoxidizing fluid within the trench during this operation of thermally treating.

2. The method of claim 1, wherein introducing the fluid comprises introducing hydrogen into the trench.

3. The method of claim 1, wherein forming the cover semiconductor region comprises epitaxially growing the cover semiconductor region over the bulk semiconductor region.

4. The method of claim 1, wherein forming the barrier layer comprises forming silicon nitride over the cover semiconductor region.

5. The method of claim 1, wherein forming the barrier layer comprises leaving a second portion of the cover semiconductor region uncovered by the barrier layer.

6. The method of claim 1, further comprising:
   forming over the trench and over the first portion of the cover semiconductor region a pad layer; and
   wherein forming the barrier layer comprises forming the barrier layer over the pad layer.

7. The method of claim 1, further comprising removing completely the barrier layer after the operation of thermally treating.

8. The method of claim 7, further comprising the operation of forming a semiconductor membrane set above, and at a distance from, the bulk semiconductor region, the semiconductor membrane starting from the cover semiconductor region.

9. The method of claim 8, further comprising providing structures for converting physical deflections of the semiconductor membrane into electrical signals.

10. The method of claim 9, further comprising forming a plurality of trenches, each trench having the shape and the remaining operations being performed on the plurality of trenches.

11. A method, comprising:
    forming a trench having a shape in a bulk semiconductor region;
    introducing a fluid into the trench;
    forming a cover semiconductor region over the bulk semiconductor region to trap the fluid within the trench;
    forming over the trench and over a first portion of the cover semiconductor region a barrier layer that functions to contain the fluid within the trench; and
    after forming the cover semiconductor region and barrier layer, modifying the shape of the trench through the migration of atoms of the semiconductor region.

12. The method of claim 11, wherein modifying the shape of the trench comprises thermally treating the bulk and cover semiconductor regions within a predetermined temperature range over which the barrier layer substantially contains the fluid within the trench.

13. The method of claim 11, wherein introducing the fluid comprises introducing hydrogen into the trench.

14. The method of claim 11, wherein forming the cover semiconductor region comprises epitaxially growing the cover semiconductor region over the bulk semiconductor region.

15. The method of claim 11, wherein forming the barrier layer comprises forming silicon nitride over the cover semiconductor region.

16. The method of claim 15, wherein the silicon nitride layer has a thickness of between 80 nm and 200 nm.

17. The method of claim 11, wherein forming the barrier layer comprises leaving a second portion of the cover semiconductor region uncovered by the barrier layer.

18. A method, comprising:
  forming in a semiconductor region a trench having a surface defining a shape of the trench;
  introducing a fluid into the trench;
  forming a cover semiconductor region over a bulk semiconductor region to trap the fluid within the trench;
  forming over the trench and over a first portion of the cover semiconductor region a barrier layer that functions to contain the fluid within the trench; and
  after formation of the cover semiconductor region and barrier layer, in an oxidizing atmosphere, modifying the shape of the trench without oxidizing the surface of the trench.

19. The method of claim 18, further comprising:
  forming over the trench and over the first portion of the cover semiconductor region a pad layer; and
  wherein forming the barrier layer comprises forming the barrier layer over the pad layer.

20. The method of claim 18, further comprising removing completely the barrier layer after the operation of modifying the shape.

21. The method of claim 20, further comprising the operation of forming a semiconductor membrane set above, and at a distance from, the semiconductor region, the semiconductor membrane starting from the cover semiconductor region.

22. The method of claim 21, further comprising providing structures for converting physical deflections of the semiconductor membrane into electrical signals.

23. The method of claim 22, further comprising forming a plurality of trenches, each trench having the shape and the remaining operations being performed on the plurality of trenches.

* * * * *